United States Patent [19]

Hulkko et al.

[11] Patent Number: 5,551,067
[45] Date of Patent: Aug. 27, 1996

[54] AMPLIFIER CONTROL SYSTEM

[75] Inventors: Jaakko Hulkko; Jorma Matero, both of Oulu; Toivo Vilmi, Haukipudas, all of Finland

[73] Assignee: Nokia Mobile Phones Ltd., Salo, Finland

[21] Appl. No.: 414,041

[22] Filed: Mar. 30, 1995

Related U.S. Application Data

[63] Continuation of Ser. No. 113,849, Aug. 27, 1993, abandoned.

[30] Foreign Application Priority Data

Sep. 23, 1992 [FI] Finland .................... 924265

[51] Int. Cl.⁶ ........................................ H04B 1/40
[52] U.S. Cl. .................. 455/88; 455/89; 455/127
[58] Field of Search ..................... 455/88, 89, 115, 455/116, 126, 127, 69, 234.1, 239.1

[56] References Cited

U.S. PATENT DOCUMENTS

| | | | |
|---|---|---|---|
| 4,992,753 | 2/1991 | Jenson et al. | 330/129 |
| 4,998,291 | 3/1991 | Marui et al. | 455/89 |
| 5,033,109 | 7/1991 | Kawano et al. | 455/127 |
| 5,033,111 | 7/1991 | Marui | 455/127 |
| 5,107,225 | 4/1992 | Wheatley, III | 455/239.1 |
| 5,128,629 | 7/1992 | Trinh | 330/129 |
| 5,150,075 | 9/1992 | Hietala et al. | 455/127 |
| 5,159,283 | 10/1992 | Jensen | 455/127 |
| 5,196,806 | 3/1993 | Ichihara | 455/127 |
| 5,235,289 | 8/1993 | Kunitomo | 455/127 |
| 5,278,997 | 1/1994 | Martin | 455/127 |

FOREIGN PATENT DOCUMENTS

| | | |
|---|---|---|
| 0434294A2 | 6/1991 | European Pat. Off. . |
| WO92/11702 | 7/1992 | WIPO ................ H04B 1/04 |

*Primary Examiner*—Reinhard J. Eisenzopf
*Assistant Examiner*—Thanh Le
*Attorney, Agent, or Firm*—Perman & Green

[57] ABSTRACT

A method of controlling an external radio frequency amplifier of a radio telephone and a control system therefore. The power amplifier of the transmission side of the radio frequency amplifier is controlled to turn on and off, on the basis of at least one control signal (BENA1, BENA2) entering the radio frequency amplifier separate from a signal to be transmitted from the radio telephone. The control signal (BENA1, BENA2) contains information about the starting and ending instant of transmission.

14 Claims, 4 Drawing Sheets

AMPLIFIER CONTROL SYSTEM

This is a continuation of application Ser. No. 08/113,849 filed on Aug. 27, 1993, now abandoned.

The present invention relates to an amplifier control system and a method of operation thereof.

In particular the present method relates to a control system for and a method of controlling an external radio frequency amplifier coupled to a radio telephone.

BACKGROUND OF THE INVENTION

The radiation power of an antenna for a radio telephone, generally receiver telephone, can in a manner known in the an be increased by placing between the telephone and the antenna a radio frequency power amplifier, a so-called "booster", or "booster amplifier". In practice also the amplification of the receiver direction must be arranged within the booster. The booster increases the radiation power of the antenna by increasing the input current of the antenna, so that the radiation power will be increased in proportion to the square of the power. For cost reasons, endeavours have been made to make the design of the booster as simple as possible, e.g. so that only the indispensable power amplifiers are provided therein.

A booster amplifier could, in principle, be connected to a digital radio telephone, preferably a digital TDMA radio telephone in a way similar to that used in analog telephones, but in practice an implementation like that would be very complicated and costly. In digital radio TDMA telephones transmissions are carried out in bursts, whereby a signal to be transmitted consists of consecutive pulses. The rise and decay of a transmission pulse should not be step-like, but the rise and decay thereof should be controlled so that the transmission spectra would not spread too much. In order to maintain the rise and decay times as short as possible the $\cos^2$-waveform has frequently been considered to be an appropriate rising and decaying pulse shape. The timing of the transmission pulse is moreover expected to be independent of the power level of the transmitter. By means of power control, the interference level of the network is reduced and the power level of telephone is decreased, said control being based on measurements made by the base station e.g. in the ((Global System Mobile) GSM system. The control range in said system is 30 dB, made out of 16 power levels within the range +43 dBm to +13 dBm.

A GSM system radio telephone is used as an example below, but the description is also applicable for other digital systems in which the shape of the pulse rise and decay is $\cos^2$ or equivalent. The transmitter of a digital radio telephone known in the art comprises a voltage-controlled RF power amplifier controlled by a control amplifier conforming to the output power of the power amplifier and the control logic. A typical block diagram of a GSM radio telephone transmitter is presented in FIG. 1. The input square wave pulses $P_{in}$ are therein amplified as desired and, as regards their rise and decay, converted into $\cos^2$ shape to form power output pulses $P_{out}$ in a multiple stage power amplifier 1. The output power is measured with the aid of a directional coupler 2 and with a power sensor 3 providing voltage $V_1$ comparable to the power. Said voltage is carried to a control amplifier 4, which can be an operational amplifier; a control pulse TXC from a D/A converter enters a second input of the control amplifier. With the aid of the control pulse, the amplitude of a transmission pulse $P_{out}$ at a desired power and the waveforms of the rising and decaying edges are formed. If the voltage $V_1$ is higher than voltage TXC, the output voltage of the power amplifier 4 will be reduced, thus resulting in the selected output power. Thus, endeavours are made to maintain with the transmission pulse the control loop 1, 2, 3, 5 in the same shape as the control pulse.

The Finnish patent application FI-896266 (equivalent U.S. Pat. No. 5,101,175 and EP patent application EP-A434 294) discloses a power control method based on two control signals for a digital radio telephone, in which method a square wave pulse is summed with the control voltage V2 (FIG. 1) of a power amplifier, said pulse starting and ending substantially at the same instant of time as a control pulse entering the control amplifier 4. In a most preferred embodiment, the square wave pulse is turned off when the control circuit of the power amplifier 1 starts to operate. In said application, a basic feature of the invention is that with a square wave pulse, the value of the control voltage V2 of the power amplifier 1 is rapidly raised at the start of the control pulse TXC close to the threshold level at which the power amplifier 1 starts to operate. Hereby, the control circuit 5 is enabled to operate as soon as power is being transmitted from the power amplifier 1. No significant delay is produced in such instance, neither resembles a rise in the output power $P_{out}$ a step at the beginning of the pulse. This is the method in which a good $\cos^2$ shape of a transmission pulse $P_{out}$ of the power amplifier 1 can be obtained right at the beginning of the pulse, and a follow-up of the TXC control pulse almost without any delays. The method introduced here is useful on the power levels required.

In designs of the type known in the art the timing information, on the basis of which either the reception or transmission is amplified, is produced from an incoming RF signal. When an RF signal enters the booster, it must respond quickly in order to raise the power level, as was stated above. Although, as according to Finnish patent application FI-896266, a good $\cos^2$ shape of the transmission pulse $P_{out}$ can be provided right at the beginning of a pulse and a follow-up of a TXC control pulse with almost no delays, the transmission spectrum will nevertheless spread to some extent.

In TDMA based radio telephone systems, a significant problem in implementing a separate high-frequency data amplifier (called an RF booster below) is how to enable the RF booster to operate entirely in synchronization with the radio telephone when the design is required to be simple, reliable, inexpensive, and applicable in a simple manner for a variety of diverse radio telephone systems, such as DAMPS, JDC and GSM.

SUMMARY OF THE INVENTION

According to the first aspect of the present invention there is provided a method of controlling an external radio frequency amplifier coupled to a radio telephone, wherein a signal received by the amplifier antenna is provided to the receiver branch of the amplifier, for amplification by an amplifier means, and a signal to be transmitted by the amplifier antenna is provided to the antenna via a power amplifier, wherein in that the power amplifier is controlled to turn on and off on the basis of at least one control signal which is provided to the amplifier separate from the signal to be transmitted.

According to a second aspect of the present invention there is provided a control system of an external radio frequency amplifier coupled to a radio telephone, said radio frequency amplifier being provided with a receiver branch and a transmitter branch, where, in an input signal coming from the amplifier antenna passes to the receiver branch which is provided with an amplifier means for amplifying the input signal, and a signal to be transmitted by the antenna is provided to the antenna from the radio telephone via the transmitter branch or the radio frequency amplifier, said transmitter branch being provided with a power amplifier for amplifying the signal to be transmitted, characterized in that at least two connectors are provided between the radio telephone and the external radio frequency amplifier, at least one of which is for transmission or a control signal from the radio telephone to the radio frequency amplifier, said control signal controlling the operation of the transmitter branch power amplifier, and at least one other connection being provided for transmission of the signals to be provided to or provided from the amplifier antenna, between the radio frequency amplifier and the radio telephone.

An advantage of the present invention is the provision of a booster arrangement for use both in continuous transmission radio telephone systems, such as NMT, and in radio telephone systems transmitting in bursts, e.g. in all systems based on TDMA, such as GSM.

Another advantage of the invention is furthermore to provide a booster arrangement wherein in the systems transmitting data in bursts the booster is provided with data in time about the instant of transmission, whereby the power of the booster can be increased in time and controlledly so that the output power provided by the booster is given enough time to settle before starting a transmission, whereby the transmission spectrum cannot spread, and respectively, when no extra power is needed any more, the booster is blanked in a controlled fashion and slowly enough, and after the signal has left the booster, the amplifier of the telephone can be turned off rapidly.

A further advantage of the invention is the introduction of a booster arrangement in which the receiver gain is measured as a function of the frequency and of the gain control signal (control voltage) of a high-frequency amplifier of the receiving branch, and the transmission gain as a function of frequency, temperature, operating voltage and power level. As taught by the invention, an RF booster operating simply in accordance with one and same concept in various TDMA-based radio telephone systems can be implemented. In dual mode networks and analog networks, a booster is enabled to operate also in continuous transmission (in non-TDMA-operation class).

The power amplifier of the transmission branch of the booster is controlled to be turned on and off on the basis of at least one control signal containing data about the starting and ending instant of the transmission entering in separation of a signal to be transmitted from the radio telephone being separate from and in functional connection to the radio frequency amplifier. In addition, the gain of the receiver amplifier is controlled on the basis of a control signal entering in separation of a signal to be received, said control signal containing data about the starting and ending instant of reception, as well as about the amplification value. Data on the power level onto which the transmitter of the radio frequency amplifier shall be controlled is carried to the booster, i.e. to the radio frequency amplifier, and from the radio frequency amplifier the data about the amplification of the receiver amplifier is carried to the radio telephone as a function of the frequency and of the gain control signal of the amplifier of the receiver side, and said data pass between the radio telephone and the booster through one and same bus. In the booster also the gain of the transmitter is measured as a function of frequency, temperature, operating voltage and power level, and the gain of the power amplifier of the transmission side is controlled, with regard to changes in said factors.

BRIEF DESCRIPTION OF THE DRAWINGS

An embodiment of the present invention is now described, by way of example, with reference to the accompanying drawings, in which.

DETAILED DESCRIPTION OF THE INVENTION

Figure 1:
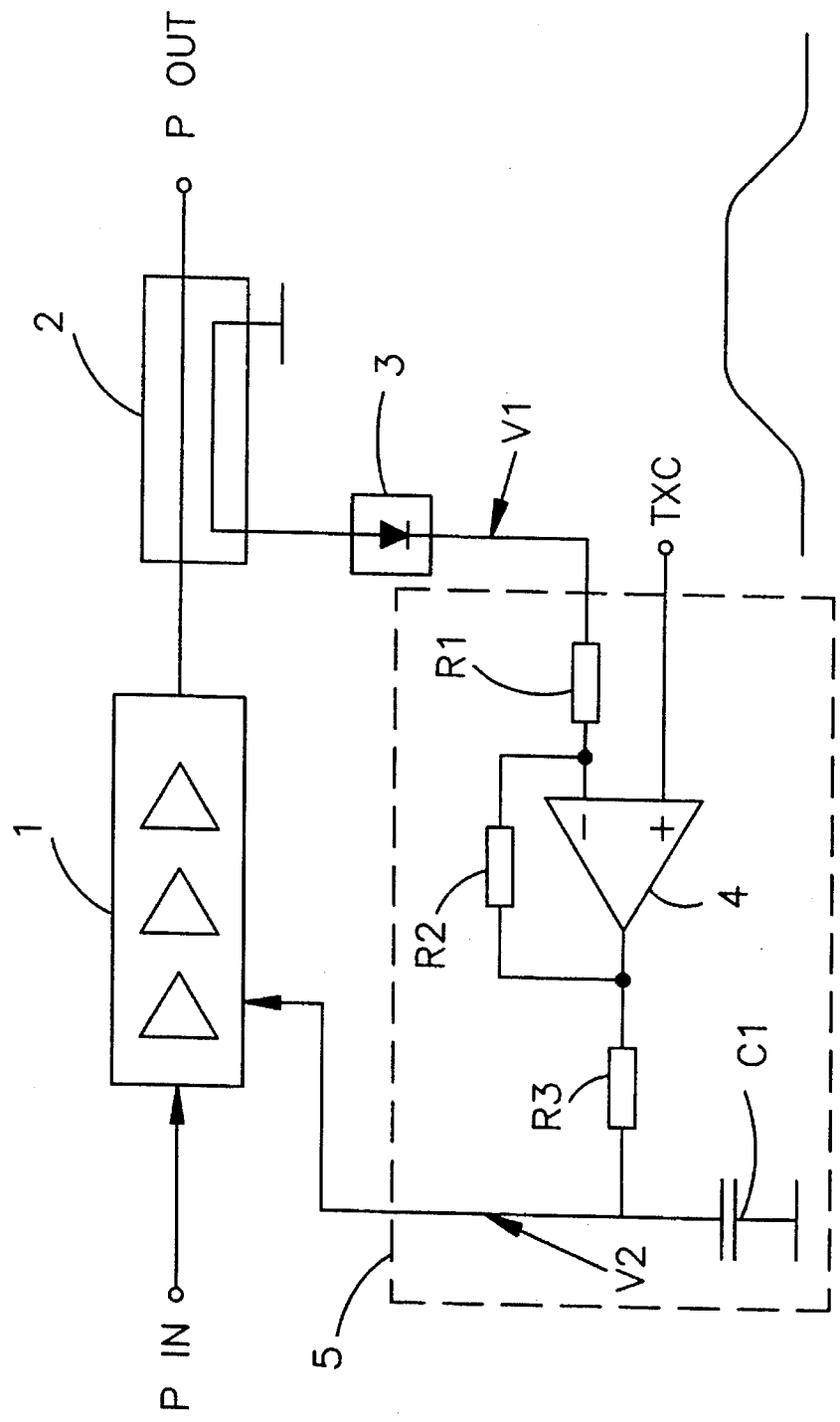
FIG. 1 is a principle block diagram of a transmitter of a radio telephone in accordance with the state of art.

A rough block diagram of a transmitter of the state of art present by FIG. 1 is described above. The invention is described below referring primarily to FIGS. 2, 3 and 4. The RF booster in accordance with the present invention, shown in FIG. 2, comprises the following components: a high-power amplifier 1, two duplex filters 6,7, a power control circuit 5 of the power amplifier 1, a means 2,3 for power measurement, installation and feedback with A/D 8 and D/A converters 9, a high frequency amplifier 10 of a receiver in which the amplification can be set, an operating voltage VB measurement and data storing part with A/D converters 11, a temperature measurement and data storing part 12 with A/D converters 13, a non-time-critical booster control and measurement data bus MBUS, time-critical booster control buses BENA1, BENA2 and AGC1, a booster control unit 14, typically being a combination of a microprocessor and a rather rapid control logic, a clock generator 15, and a switch 17 switching off the operating voltage from the power amplifier.

Figure 2:
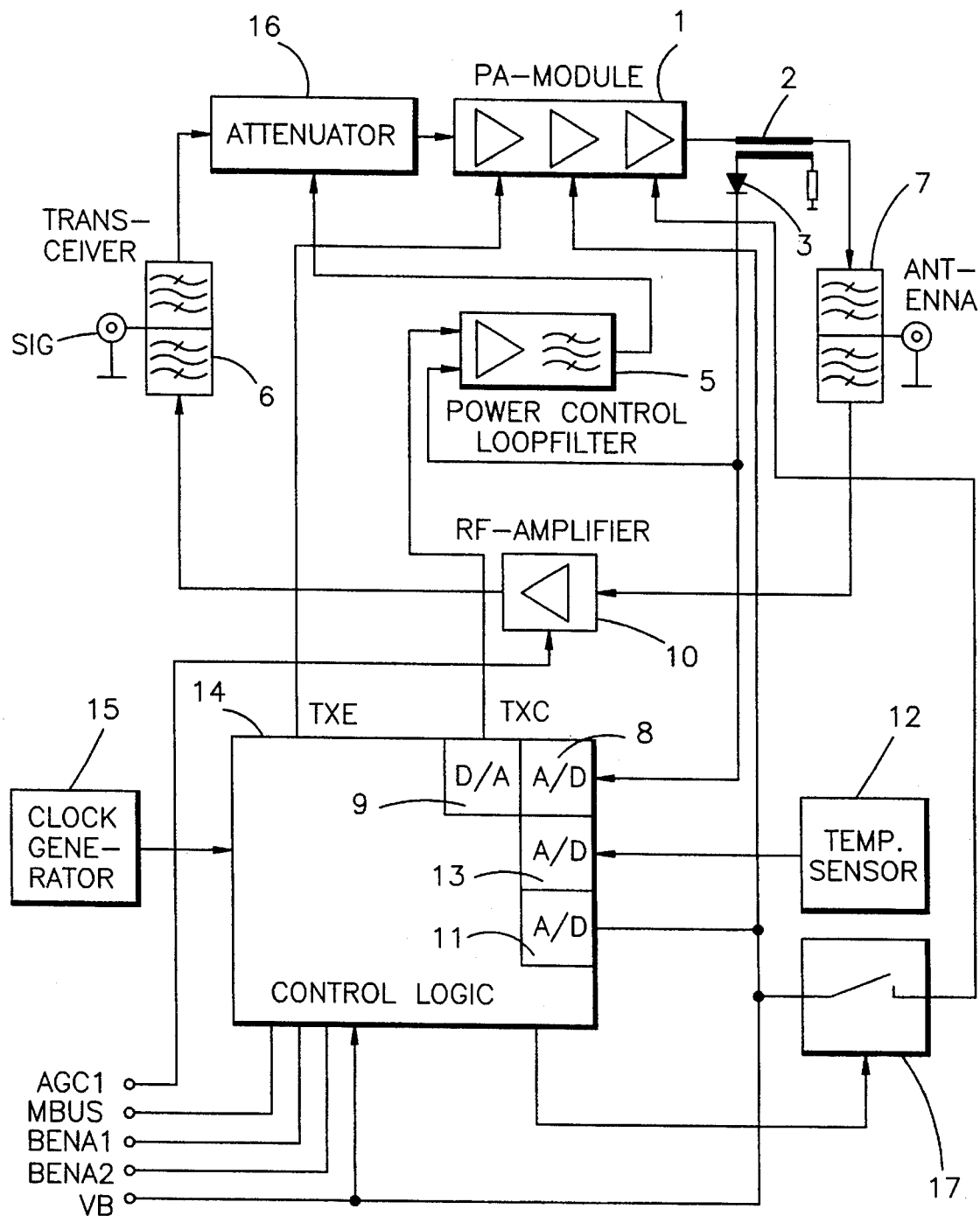
FIG. 2 illustrates a block diagram of an RF booster in accordance with the invention.

Thus, FIG. 2 shows a great number of blocks already known in prior art power amplifier designs, such as the one shown in FIG. 1. Said blocks are a power amplifier 1, a directional coupler 2, a power sensor 3 and a power control circuit 5 of the power amplifier, and a D/A converter 9 to produce the TXC control pulse. The boosters are usually also provided with a high-frequency amplifier 10 for the receiver and duplex filters 6,7, said filters being two-part band-pass filters.

Figure 3:
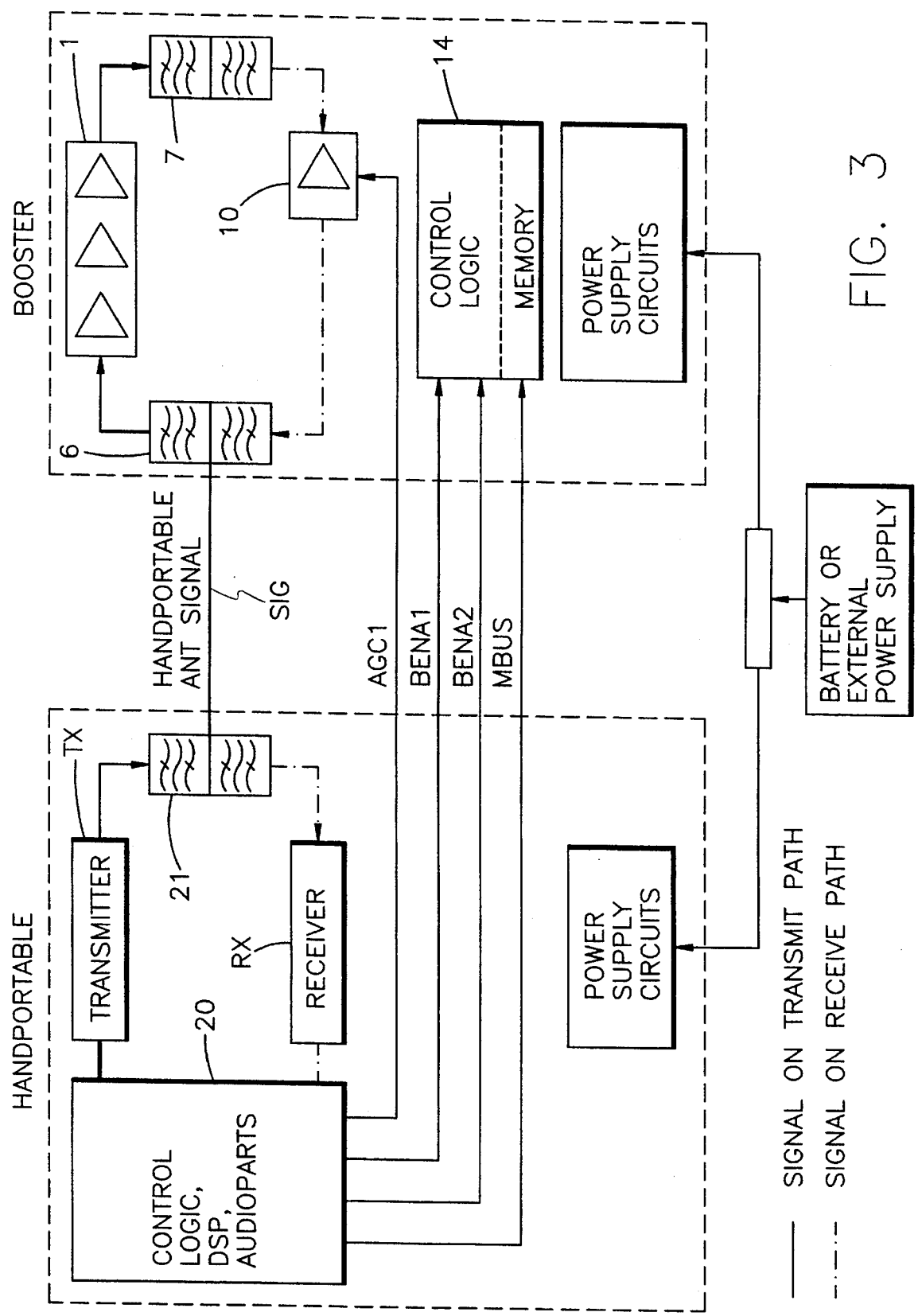
FIG. 3 illustrates block diagrams of the RF booster of FIG. 2 and its controller (e.g. radio telephone), and the connections therebetween.

A received signal enters a duplex filter 7 from an antenna, from which filter the signal passes through the receiver amplifier 10 to a second duplex filter 6, wherefrom the signal is carried to a radio telephone (FIG. 3). During the transmission, the signal passes through the duplex filter 6 in association with the radio telephone connection SIG via an attenuator 16, the amplifier 1 and the directional coupler 2 of the transmitter to the duplex filter 7, from where the signal passes to the antenna. The above facts are known in themselves and are clear to a person skilled in the art, and, as regards certain features, they may be implemented in different ways.

Instead of the duplex filter 6 in association with the radio telephone connector SIG, a switch only can be used in a TDMA-based system to connect the connector either to the transmitter side of the booster, or respectively, to the receiver side according to certain predetermined transmission and reception instants of time.

In continuous transmission systems, two separate connectors can be used to a radio telephone instead of a duplex filter 6, one of said connectors connecting the receiver of the radio telephone to the receiver branch of the booster, and the other connector connecting the transmitter of the radio telephone to the transmission branch of the booster. The present invention is not, therefore, related to the amplifier design of the booster as such, but to a control, a control method and a control system thereof.

The blocks comprise, as shown in FIG. 2, a control block 14 and the A/D converters 8,11,13 depicted therein side, and a temperature measurement unit 12 and a clock generator 15. In addition, the booster control lines AGC1, BENA1, BENA2 and MBUS depicted both in FIG. 2 and in FIG. 3 are features of the invention. The radio frequency amplifier in accordance with the present invention, such as the one presented in FIG. 2, can be implemented as a unit in separation of the radio telephone but attachable thereto, or as a radio frequency amplifier unit fixedly attached to the radio telephone. Preferably however as a separate radio frequency amplifier unit (to which the invention relates), because the telephone is provided with amplifiers of its own in the receiver and in the transmitter. The booster is used when extra power is needed. Usually a booster installation is provided in a car environment.

FIG. 3 shows more in detail the connection of the booster to the radio telephone. A radio telephone is provided with a block 20 comprising a control logic, digital components for processing signals, and audioparts, with a receiver RX, a transmitter TX, and a duplex filter 21 positioned before the antenna connection. The receiver RX and the transmitter TX can be a transmitter and receiver of a prior an radio telephone. The booster is connected to the radio telephone, to the antenna terminal (SIG) thereof, from which the RF signal is received to the booster to be amplified during transmission, respectively, an amplified RF signal is received from the booster in the reception. The booster is further connected to the control buses AGC1, BENA1, BENA2 and MBUS between the radio telephone and the booster. Along said buses. The radio telephone provides the booster with control signals controlled by the control block 20, respectively receiving information from the booster control block 14. Both the radio telephone and the booster are provided with power supply circuits, which can be connected to an accumulator, a battery, or an external power supply unit.

The RF booster is controlled with an external controlling means like a radio telephone, preferably a hand portable, providing the booster with control signals AGC1, BENA1, BENA2 and MBUS. The control is described below referring to FIGS. 2, 3 and 4. MBUS is a multiple-use bus in which non-time-critical control data of e.g. 9600 baud is transmitted from a radio telephone to an RF booster and measurement and calibration data from the RF booster to the radio telephone. The bus is also used in the production for transmitting data required in calculating the booster calibration data from external measurement means to the booster.

Said control data to be transmittal in an MBUS bus is as follows:

data about whether the booster has been activated for use or not, and the power level of the booster transmitter;

the above measurement and calibration data are as follows:

the gain of the RX chain (receiving chain) of the booster as a function of frequency and of the gain control signal (control voltage) of the RF amplifier 10, the gain of the TX chain of the booster (transmission chain) as a function of frequency, temperature, operating voltage and power level (said data is not transmitted from the booster to the radio telephone).

The calibration data can be stored in the booster, e.g. in the memory in the control block 14 (e.g. EEPROM), and the measurement data can, after the measurement, be stored in the booster. When a message to set the power comes from the radio telephone to the booster, it looks up from the memory a correction voltage that takes into consideration the non-idealistics relating to the measurement and calibration data corresponding to the given power level and controls with the voltage the power of the transmitter through the power control circuit 5.

Figure 4:
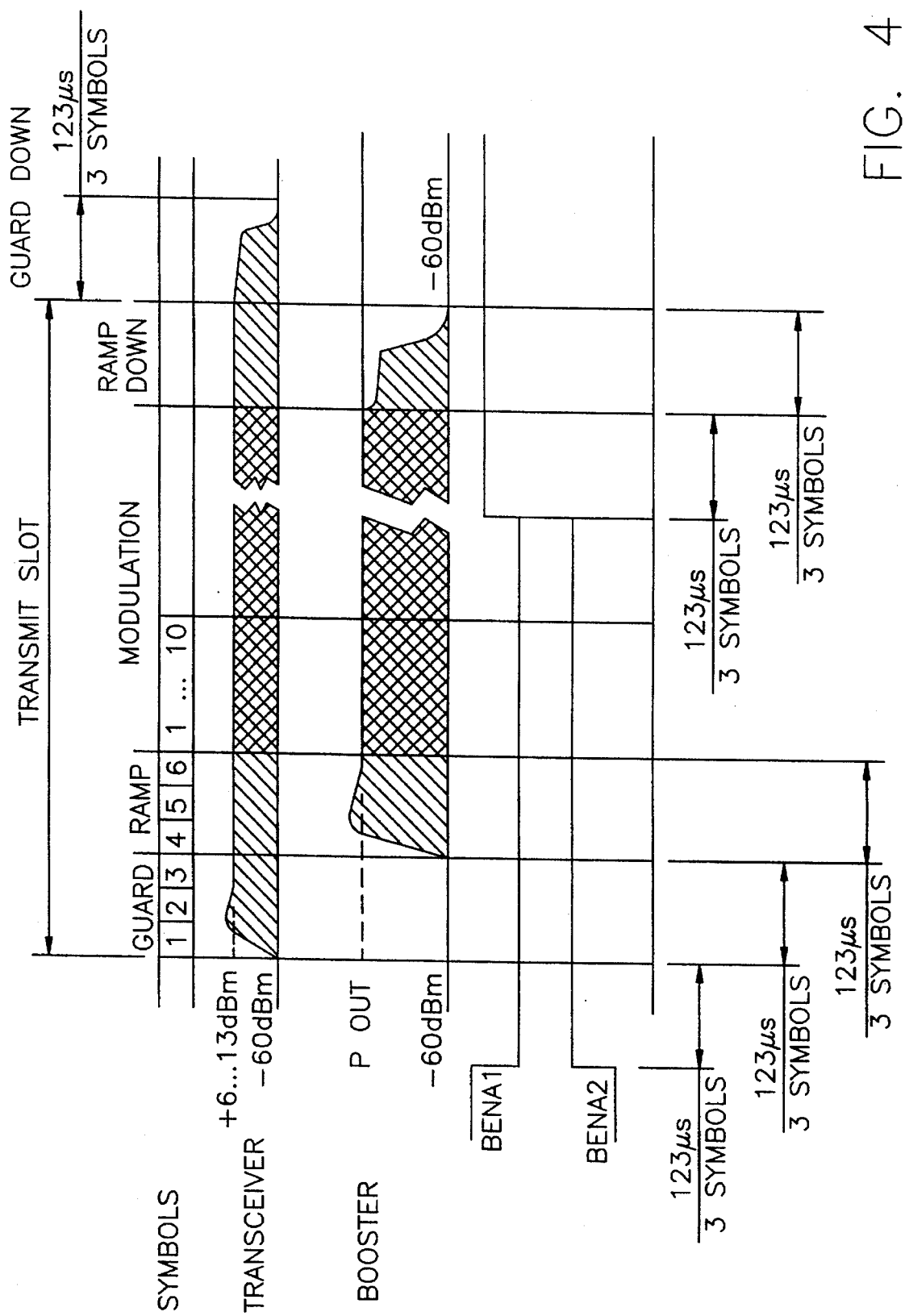
FIG. 4 illustrates a timing diagram between the RF booster of FIG. 2 and its controller.

BENA1 and BENA2 are time-critical control signals from the radio telephone to the RF booster, said signals being synchronized according to the time diagram, shown in FIG. 4, with the starting and ending point of the frame to be transmitted in the radio telephone. One separate control signal BENA is sufficient for controlling the invention the transmission of the booster. It is, however, preferable to ensure the operation with another BENA signal in case of potential interferences.

As shown in FIG. 4, the logical states of the BENA signals are changed immediately before the transmission. It is not of a great importance in itself whether their states are changed before the transmission and the length of the time therebefore, but the essential point is that they include information about starting the transmission. Respectively, before terminating a transmission, the booster is provided with information with the aid of a BENA signal about the termination of transmission, whereby the power can be turned off from the booster.

In FIG. 4, the control signals BENA1 and BENA 2 are presented in opposite phases. It is preferable that they are in opposite status because a potential interference may affect in one direction and therefore it is not enabled to affect both of the signals BENA1, BENA2 as they are in opposite states. They may also be in the same state. The timing signal BENA observes all factors affecting the length, the starting and ending instant of time of the transmission. As a deviation from the known designs, the timing information is thus not provided from an entering RF signal but from a control block, as is taught by the invention, preferably from a radio telephone, in the form of time-critical control signals BENA1, BENA2. When the telephone has been informed of a starting instant of transmission, the output power level of the rf signal of the telephone (TRANSCEIVER) is first raised (i.e. GUARD time interval), during which the output power of the booster (BOOSTER) must remain below a given level, e.g. below −60 dBm, that is, when the RF booster is in operation, the transmitter TX of the radio telephone starts first, whereafter the transmitter of the Rf booster starts.

The powers of the telephone and booster amplifiers must be increased at different points of time, not to cause any interference to each other. The telephone informs the booster of the start of transmission with a BENA signal, as described above, and when a uniform RF signal has been produced in the telephone, the power of the booster (Ramp time interval) is increased so that it is uniform when the actual transmission starts (Modulation time interval). After the transmission is over, the telephone informs the booster thereabout with the aid of a BENA signal, whereby the power of the booster is reduced in the course of a given time interval, and thereafter, the power of the amplifier of the radio telephone is reduced, as shown in FIG. 4.

When the RF booster is in use, the radio telephone is set in the transmission mode of a "lengthened frame", whereby a certain amount of given data (e.g. zero symbol sequence) is added between the Ramp-up and Ramp-down parts of the transmission frame of the radio telephone and the actual data pan (Ramp-up time interval and Ramp-down time interval), during which time the RF booster accomplishes a ramp-up and ramp-down functioning of its own. In addition, the transmission frame of the radio telephone is speeded up by a first data sequence added (numbers in FIG. 4 are exemplary, not binding; they can be used in a DAMPS product). When the RF booster is in use, the transmitter of a radio telephone is set on a given, fixed predetermined power level for the course of the transmission independent of the transmission power level required of a RF booster.

The BENA signals synchronized into the transmission frame start and turn off the rapid counter in the RF booster (in control block 14), said counter defining and triggering with accuracy the starting and ending of the RF booster transmission. The counter is clocked by a clock generator 15 provided with sufficient stability for counting a precise point of transmission. The same clock generator 15 is used typically for controlling the synchronic logic 14 and operation of the RF booster. Since the power increase time interval is very short in the transmission compared with the transmission time, an absolute time error to be produced is extremely small. Therefore, the relative and absolute stability requirement required of the clock generator is small. As shown in FIG. 2, the booster is provided with a switch 17 between the operating voltage VB and the power amplifier 1 of the transmission branch so that when a control command has been given to the booster to reduce the power in an instance when there is an interference therein, because of which the power cannot be reduced, the operating voltage VB can be switched off with the switch 17, and in such manner the power can be turned off from the booster. Also a possible solution to switch off the booster, i.e. to put the booster in a non-active state is to adjust its operating point into class C. Since the power amplifier 1 can comprise several amplifiers in serves it is not necessary to switch off all amplifiers so as well only some of the serves coupled amplifiers may be put in a non-active state.

The AGC1 is a time-critical control signal from a radio telephone to a RF booster 10 of a receiver, said signal being synchronized with the starting point of a frame to be received in a radio telephone. With the AGC1 signal the amplification of the RF amplifier 10 of the receiver is controlled, this being so dependent on the level of the antenna signal that the dynamics requirements of the radio telephone receiver can be minimized. The use of an AGC1 signal is not indispensable.

What is essential with a view to the operation of an RF booster is that the calibration data of the reception and transmission chain (as mentioned above) are measured and stored in the RF booster. For instance in production when a booster is connected to a radio telephone, RX calibration data are automatically transmitted to the radio telephone, wherewith it is enabled to calculate the actual signal strength. The radio telephone is also enabled to request, if needed, the booster to provide measurement and calibration information. With the aid of the transmission calibration data, the RF booster is itself enabled to calculate and to set the gain of the transmission side amplifier so that the output power of the booster is correct on the normal output levels thereof (+43 dBm to +13 dBm in GSM), i.e. the calibration and measurement data are taken into consideration in setting the gain and output power of the power amplifier 1.

In calculating the reception and transmission calibration data the booster utilizes a temperature sensor 12 and a control block 14. By temperature measurement, changes caused possibly by temperature in the gain can be compensated. A duplex filter 7 positioned before the antenna terminal frequently reduces the power by e.g. 1 dB. By means of compensation, this can be taken into consideration in advance, whereby the gain (in transmission) is so controlled that a somewhat higher power is supplied to the duplexer 7 in order to provide a desired power in the antenna. In addition, when calculating the calibration values of the transmission power, the booster makes use of the operating voltage measurement data. On the basis of the reception calibration data and the field strength data of its own, the radio telephone is able to calculate the actual antenna field strength when the booster is in operation.

The amplification and dynamics of the high-frequency front end of a radio telephone is so controlled within the radio telephone that when the booster is in use. The front end gain is reduced and the dynamics is so increased that the entity composed of the booster and the radio telephone meets the requirements concerning dynamics and sensitivity set for said entity. When using the booster, the operating voltage of the telephone is typically supplied by means of e.g. a car accumulator, whereby the power consumption of said entity need not be minimized. When the booster is not in use, the gain of the telephone amplifier is increased and the dynamics is so set that the entity constituted by the radio telephone meets the dynamics and sensitivity requirements set thereto, and moreover so that the power consumption of the radio telephone can be minimized and that its life time can be maximized when the telephone is in handportable use.

An advantage of the present invention is clear since by using one and same concept, an RF booster of a radio telephone can be implemented in a plurality of TDMA based and so-called dual mode radio telephone networks. The RF booster is furthermore advantageous because it is simple in structure. The RF booster described above is also appropriate for use as such in continuous transmission (FDMA-based) radio telephone networks, such as AMPS, NMT, TACS, NETZ-C and spread spectrum networks. In such cases, the booster is always kept switched on during transmission, and not only at predetermined time intervals, as in the TDMA based systems. The booster in accordance with the invention is, however, most preferable in TDMA-type systems.

In view of the foregoing it will be clear to a person skilled in the art that modifications may be incorporated without departing from the scope of the present invention.

What we claim is:

1. A control system for an external radio frequency amplifier coupled to a radio telephone, said radio frequency amplifier being provided with a receiver branch and a transmitter branch, wherein an input signal coming from an amplifier antenna passes to the receiver branch which is provided with receive amplifier means for amplifying the input signal, and a signal to be transmitted by the antenna is provided to the antenna from the radio telephone via the transmitter branch which includes a power amplifier means for amplifying a signal to be transmitted, said control system further comprising:

transmitter means in said radio telephone for amplifying and providing a signal to be transmitted;

control means in said radio telephone for implementing a lengthened frame mode by adding plural data sequences between a power ramp-up and a power ramp-down of said transmitter means, one data sequence occurring before said signal to be transmitted and a second data sequence occurring after said signal to be transmitted, and for providing a pair of opposite phase control signals, each comprising a first portion occurring during said one data sequence before said signal to be transmitted and a second portion occurring during said second data sequence after said signal to be transmitted;

at least two connectors provided between the radio telephone and the external radio frequency amplifier, at least one connector enabling transmission of said pair of opposite phase control signals, during said added data sequences, from the radio telephone to the radio frequency amplifier, wherein said transmitter branch power amplifier means is responsive to said opposite phase control signals to reach an operating power level during said one added data sequence and to decrease said operating power during said second added data sequence; and at least one other connector provided for transmission of signals provided to or provided from the amplifier antenna, between the radio frequency amplifier and the radio telephone.

2. A system as claimed in claim 1, wherein the radio frequency amplifier comprises a memory in which information from said opposite phase control signals is stored.

3. A system as claimed in claim 1, further comprising means for compensating for changes in transmission frequency, temperature, operating voltage and power level during control of the power level of the transmitter branch power amplifier means by said opposite phase control signals.

4. A system as claimed in claim 1, wherein the radio frequency amplifier includes a control block to control the transmitter branch power amplifier means in response to said opposite phase control signals received from the radio telephone.

5. A system as claimed in claim 1, wherein the radio telephone is a TDMA-based telephone.

6. A system as claimed in claim 1, wherein the radio telephone is a dual mode radio telephone.

7. An external radio frequency amplifier for connection to a radio telephone, said radio telephone including control signal outputs for providing a pair of opposite phase, control signals, each comprising a first portion at least a first time interval before a start of a data transmission and a second portion at an end of said data transmission, said external radio frequency amplifier comprising:

a power amplifier coupled between an antenna connection and a signal transmission input from said radio telephone;

control input means for providing said opposite phase control signals from said radio telephone; and control logic means coupled between said control input means and said power amplifier and responsive to at least one of said pair of opposite phase control signals, a first portion thereof causing an increase in power of said power amplifier during said first time interval to an operating level and a second portion thereof causing a reduction of said power of said power amplifier from said operating level.

8. The external radio frequency amplifier as recited in claim 7 further comprising:

receive amplifier means for coupling said antenna connection to said radio telephone, said control logic means further providing an output to said radio telephone of data indicative of the gain of said receive amplifier means as a function of frequency and of a gain control signal for said receive amplifier means.

9. The external radio frequency amplifier as recited in claim 7 further comprising a memory in which information from said opposite phase control signals is stored.

10. The external radio frequency amplifier as recited in claim 7 further comprising a control block to control the power amplifier in response to said opposite phase control signals received from the radio telephone.

11. The external radio frequency amplifier as recited in claim 7 wherein said radio telephone is a TDMA-based telephone.

12. The external radio frequency amplifier as recited in claim 7 wherein said radio telephone is a dual mode radio telephone.

13. The external radio frequency amplifier as recited in claim 7 wherein said control signal outputs further provide a power level signal, said control logic means being responsive to said power level signal to adjust said power of said power amplifier.

14. The external radio frequency amplifier as recited in claim 13 further comprising means for compensating for changes in transmission frequency, temperature, operating voltage and power level during control of the power of the power amplifier by said power level signal.

* * * * *